(12) United States Patent
Mori et al.

(10) Patent No.: US 10,424,542 B2
(45) Date of Patent: *Sep. 24, 2019

(54) SEMICONDUCTOR DEVICE

(71) Applicant: KABUSHIKI KAISHA TOSHIBA, Tokyo (JP)

(72) Inventors: Kentaro Mori, Fujisawa Kanagawa (JP); Chiaki Takubo, Sumida Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 14 days.

This patent is subject to a terminal disclaimer.

(21) Appl. No.: 15/819,117

(22) Filed: Nov. 21, 2017

(65) Prior Publication Data
US 2018/0096944 A1 Apr. 5, 2018

Related U.S. Application Data

(63) Continuation of application No. 15/448,269, filed on Mar. 2, 2017, now Pat. No. 9,852,995.

(30) Foreign Application Priority Data

Sep. 21, 2016 (JP) .................................. 2016-184485

(51) Int. Cl.
*H01L 23/48* (2006.01)
*H01L 23/538* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ... H01L 23/48; H01L 23/3114; H01L 23/3128
See application file for complete search history.

(56) References Cited

U.S. PATENT DOCUMENTS 7,183,639 B2 2/2007 Mihara et al.
9,385,006 B2 7/2016 Lin et al.
(Continued)

FOREIGN PATENT DOCUMENTS

JP H07-245362 9/1995
JP H10-98140 4/1998
(Continued)

*Primary Examiner* — Mark V Prenty
(74) *Attorney, Agent, or Firm* — Kim & Stewart LLP

(57) ABSTRACT

A semiconductor device includes a first semiconductor chip having a first surface with a semiconductor element and a second surface opposing the first surface. A first metal layer has a third surface supporting the first semiconductor chip and a fourth surface opposing the third surface. The third surface is larger than the second surface. A resin layer has a fifth surface facing the first semiconductor chip and a sixth surface facing the first metal layer. A pad is on the first surface of the first semiconductor chip. A first via contact is within the resin layer on the third surface of the first metal layer. A second via contact is within the resin layer on the pad. The first and second via contacts are connected to first and the second interconnects, respectively.

18 Claims, 11 Drawing Sheets

(51) Int. Cl.
*H01L 21/48* (2006.01)
*H01L 21/56* (2006.01)
*H01L 21/78* (2006.01)
*H01L 23/31* (2006.01)
*H01L 23/00* (2006.01)

(52) U.S. Cl.
CPC ............ *H01L 21/565* (2013.01); *H01L 21/78* (2013.01); *H01L 23/3114* (2013.01); *H01L 23/5383* (2013.01); *H01L 23/5386* (2013.01); *H01L 24/19* (2013.01); *H01L 24/20* (2013.01); *H01L 24/96* (2013.01); *H01L 24/97* (2013.01); *H01L 21/561* (2013.01); *H01L 21/568* (2013.01); *H01L 23/3128* (2013.01); *H01L 2224/04105* (2013.01); *H01L 2224/12105* (2013.01); *H01L 2224/29139* (2013.01); *H01L 2224/29339* (2013.01); *H01L 2224/32225* (2013.01); *H01L 2224/32245* (2013.01); *H01L 2224/73267* (2013.01); *H01L 2224/83005* (2013.01); *H01L 2224/8384* (2013.01); *H01L 2224/83851* (2013.01); *H01L 2224/92244* (2013.01); *H01L 2224/94* (2013.01); *H01L 2224/97* (2013.01); *H01L 2924/10253* (2013.01); *H01L 2924/13055* (2013.01); *H01L 2924/13064* (2013.01); *H01L 2924/3025* (2013.01)

(56) References Cited

U.S. PATENT DOCUMENTS

| 9,466,542 | B2 * | 10/2016 | Inaba ................. H01L 23/48 |
| 9,852,995 | B1 * | 12/2017 | Mori .................. H01L 21/4853 |
| 10,090,238 | B2 * | 10/2018 | Sakamoto ........... H01L 24/76 |
| 2004/0183192 | A1 | 9/2004 | Otsuka et al. |

FOREIGN PATENT DOCUMENTS

| JP | 2000-349100 | 12/2000 |
| JP | 2003-273314 | 9/2003 |
| JP | 2004-221417 | 8/2004 |
| JP | 2004-235523 | 8/2004 |
| JP | 2008-205123 | 9/2008 |
| JP | 2008-305838 | 12/2008 |
| JP | 2016-025143 | 2/2016 |

* cited by examiner

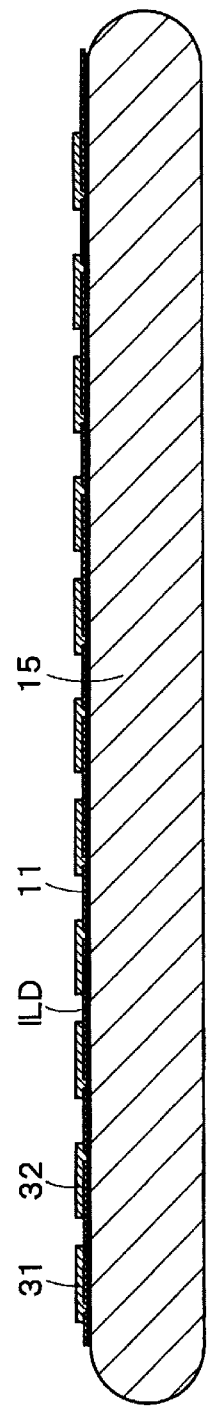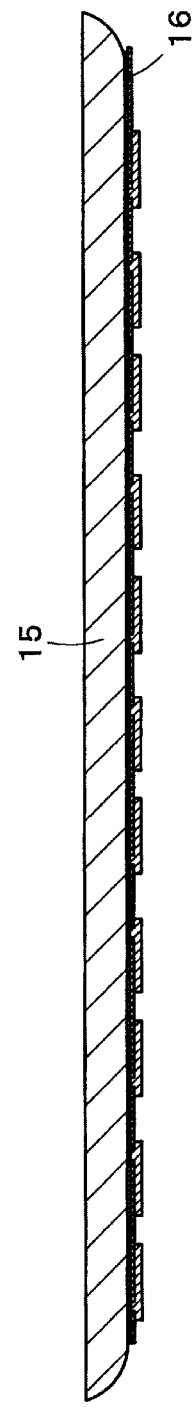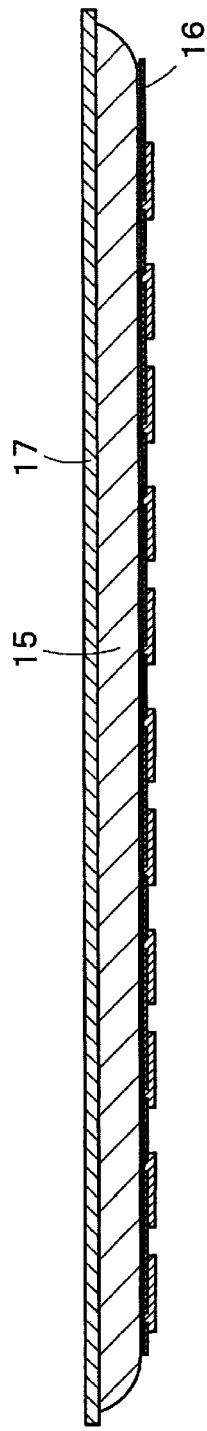

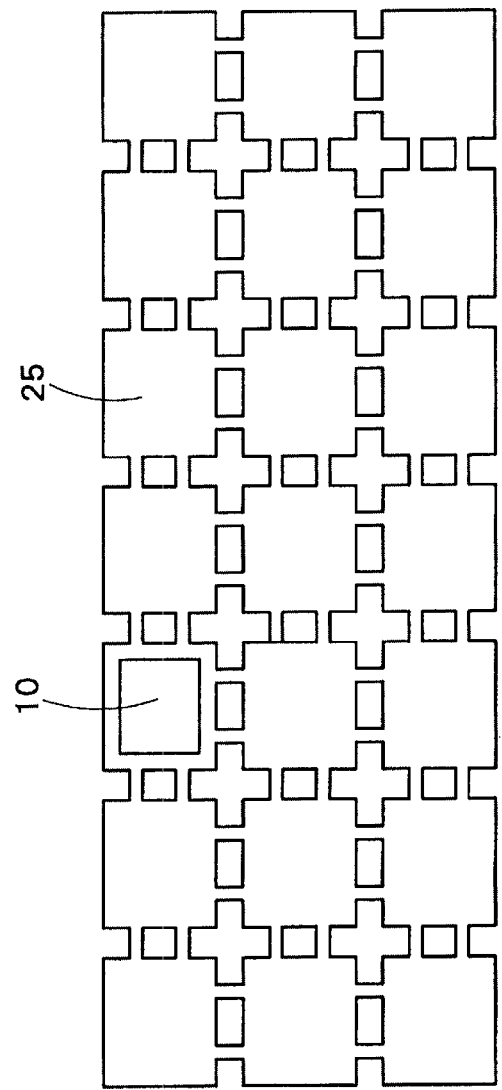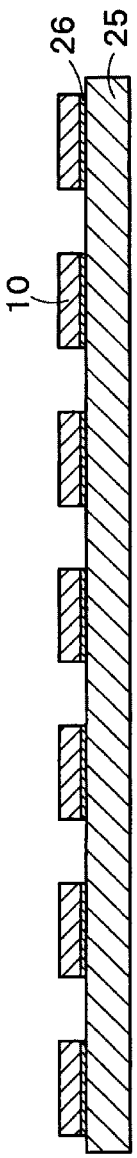
FIG. 4A
FIG. 4B

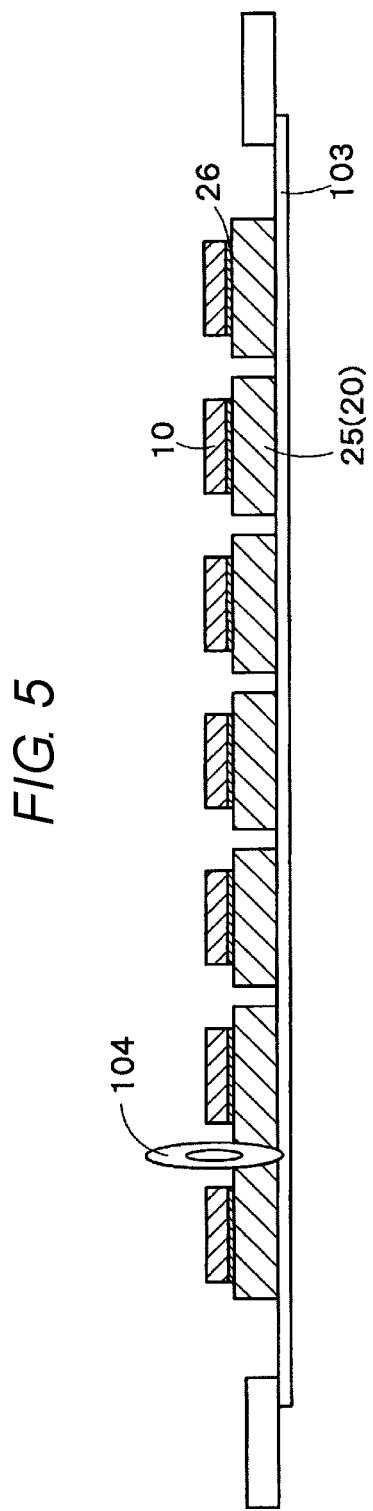

SEMICONDUCTOR DEVICE

CROSS-REFERENCE TO RELATED APPLICATION

This application is a continuation of U.S. patent application Ser. No. 15/448,269, filed on Mar. 2, 2017, which is based upon and claims the benefit of priority from Japanese Patent Application No. 2016-184485, filed on Sep. 21, 2016, the entire contents of each of which are incorporated herein by reference.

FIELD

Embodiments described herein relate generally to a semiconductor device.

BACKGROUND

There is a known semiconductor package having, as fan-out interconnects, metal plated interconnects on a front surface of a semiconductor chip and via contacts provided within an encapsulation resin of the semiconductor chip. Such a fan-out semiconductor package is often provided with a metal layer as a rear surface electrode of the semiconductor chip. Conventionally, the via contacts and the interconnects are provided both on the front surface and a rear surface of the semiconductor package in order to connect the interconnects to pads on the front surface of the semiconductor chip and to the metal layer on the rear surface thereof.

Providing the via contacts and the interconnects both on the front surface and the rear surface of the semiconductor package prolongs the manufacturing process and requires more materials necessary for the via contacts and the interconnects.

DESCRIPTION OF THE DRAWINGS

FIGS. 2A to 2C are cross-sectional views illustrating an example of a method of manufacturing the semiconductor device according to the first embodiment.

FIGS. 4A and 4B are a plan view and a cross-sectional view, subsequent to FIG. 3, illustrating the example of the method of manufacturing the semiconductor device, respectively.

FIG. 5 is a cross-sectional view, subsequent to FIGS. 4A and 4B, illustrating the example of the method of manufacturing the semiconductor device.

DETAILED DESCRIPTION

Embodiments provide a semiconductor device having via contacts and interconnects on electrodes on a front surface and a rear surface of a semiconductor chip within a resin which is easily manufactured at a relatively low cost.

In general, according to one embodiment, a semiconductor device includes a first semiconductor chip having a first surface with a semiconductor element and a second surface opposite the first surface. A first metal layer has a third surface supporting the first semiconductor chip and a fourth surface opposite the third surface, and the third surface of the first metal layer has an outer edge larger than an outer edge of the second surface of the first semiconductor chip. A resin layer is around the first semiconductor chip and the first metal layer and has a fifth surface near the first semiconductor chip and a sixth surface near the first metal layer. A pad is on the first surface of the first semiconductor chip and is electrically connected to the semiconductor element. A first via contact is within the resin layer and is on the third surface of the first metal layer. A second via contact is within the resin layer and is on the pad. A first interconnect is on the fifth surface of the resin layer and is electrically connected to the first metal layer via the first via contact. A second interconnect is on the fifth surface of the resin layer and is electrically connected to the pad via the second via contact.

Embodiments according to the present disclosure will be described hereinafter with reference to the drawings. The present embodiments are not intended to limit the present disclosure.

Figure 1:
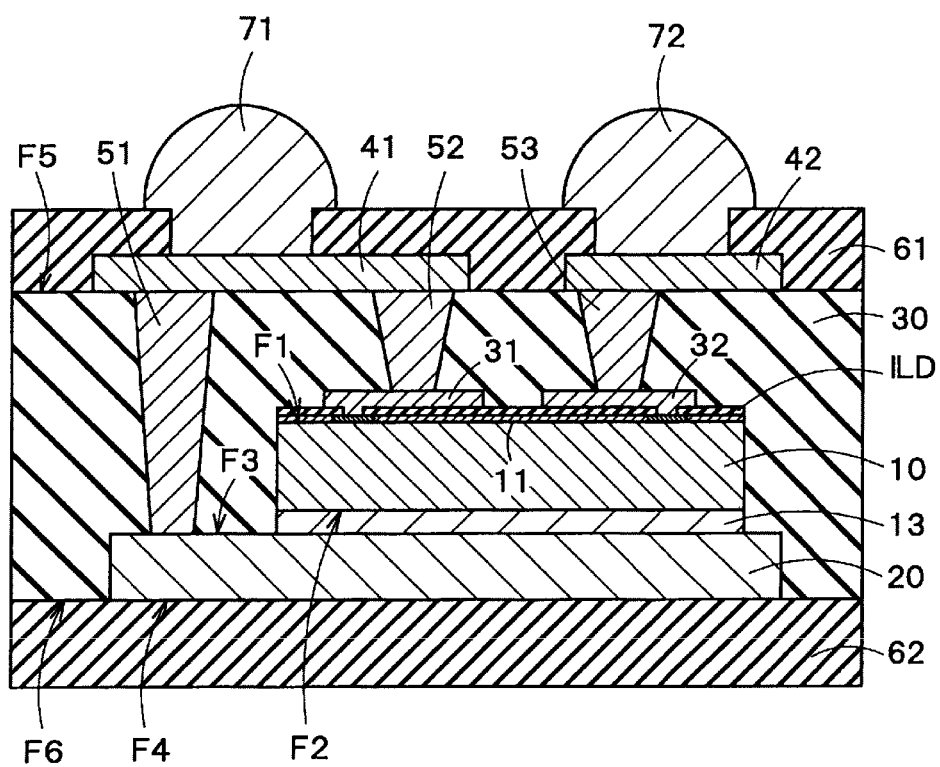
FIG. 1 is a cross-sectional view illustrating an example of a configuration of a semiconductor device according to a first embodiment.

(First Embodiment) FIG. 1 is a cross-sectional view illustrating an example of a configuration of a semiconductor device 1 according to a first embodiment. The semiconductor device 1 includes a semiconductor chip 10, a metal layer 20, a resin layer 30, pads 31 and 32, package interconnects 41 and 42, via contacts 51 to 53, solder resists 61 and 62, and terminals 71 and 72.

The semiconductor chip 10, as a first semiconductor chip, has a first surface F1 on which a semiconductor element 11 is provided, and a second surface F2 opposite to the first surface F1. The semiconductor chip 10, as a semiconductor element, may be, for example, a power semiconductor element such as an IGBT (Insulated Gate Bipolar Transistor) or an HEMT (High Electron Mobility Transistor) that can carry a high current between the first surface F1 and the second surface F2.

The metal layer 20, as a first metal layer, has a third surface F3 on which the semiconductor chip 10 is placed, and a fourth surface F4 opposite to the third surface F3. The third surface F3 faces the second surface F2 of the semiconductor chip 10 and is adhesively bonded to the semiconductor chip 10 by a conductive material 13. The third surface F3 has an outer edge (peripheral region) that is larger than an outer edge (peripheral region) of the second surface F2 of the semiconductor chip 10. Therefore, the metal layer 20 is provided to entirely cover (surround) the second surface F2 of the semiconductor chip 10. For example, a metallic material including one of copper, iron, nickel, stainless steel, and the like may be used for the metal layer 20. Alternatively, a semiconductor such as silicon, glass, or an organic substrate may be used for the metal layer 20. In the alternative case, it is necessary to provide a metal coat and a metal interconnect on a front surface (third surface F3) of the metal layer 20 so as to exhibit conductivity. For example, a conductive material such as a solder, a silver paste or a silver sintered paste may be used as the conductive material 13. The resin layer 30 is provided around the semiconductor chip 10, the metal layer 20, and the via contacts 51 to 53, and has a fifth surface F5 provided on the side of the semiconductor chip 10 and a sixth surface F6 provided on the side of the metal layer 20. The semiconductor chip 10, the metal layer 20, and the via contacts 51 to 53 are encapsulated in the resin layer 30, and the resin layer 30 protects the semiconductor chip 10, the metal layer 20, and the via contacts 51 to 53 from outside of the resin layer 30.

The pads 31 and 32 are provided on the first surface F1 of the semiconductor chip 10 via an interlayer insulating film ILD, and are electrically connected to the semiconductor element 11 in opening portions of the interlayer insulating film ILD, respectively. The pads 31 and 32 function as lead-out interconnects (fan-out interconnects) extending out from the semiconductor element 11. The pads 31 and 32 are electrically connected to the semiconductor element 11 and may be formed from, for example, a low electrical resistance metal such as plated copper, aluminum or nickel.

The via contact 51, as a first via contact, is provided within the resin layer 30 and is provided on the third surface F3 of the metal layer 20. The via contacts 52 and 53, as second via contacts, are provided within the resin layer 30 and are provided on the pads 31 and 32, respectively. The via contact 51 extends out from the third surface F3 of the metal layer 20 toward the fifth surface F5 of the resin layer 30, and electrically connects the metal layer 20 to the interconnect 41 provided on the fifth surface F5. The via contact 52 extends out from the pad 31 toward the fifth surface F5 of the resin layer 30, and electrically connects the pad 31 to the interconnect 41. The via contact 53 extends out from the pad 32 toward the fifth surface F5 of the resin layer 30, and electrically connects the pad 32 to the interconnect 42.

The interconnect 41, as a first interconnect, is provided on the fifth surface F5 of the resin layer 30 and is electrically connected to the pad 31 and the metal layer 20 via the via contacts 51 and 52, respectively. The interconnect 42, as a second interconnect, is provided on the fifth surface F5 of the resin layer 30 and is electrically connected to the pad 32 via the via contact 53. For example, a low electrical resistance metal such as copper or aluminum is used for the interconnects 41 and 42. In this way, the interconnects 41 and 42 are provided on one surface (for example, the fifth surface F5) of the resin layer 30.

The via contact 51, as the first via contact, is provided within the resin layer 30 and electrically connects the third surface F3 of the metal layer 20 to the interconnect 41. The via contact 52, as the second via contact, is provided within the resin layer 30 and electrically connects the pad 31 connected to the semiconductor element 11 to the interconnect 41. The via contact 53, as the second via contact, is provided within the resin layer 30 and electrically connects the pad 32 connected to the semiconductor element 11 to the interconnect 42.

The solder resist 61 is provided on an upper surface of the resin layer 30 and partially covers the interconnects 41 and 42. The solder resist 62 is provided on a bottom surface of the resin layer 30 and covers a rear surface of the metal layer 20. The solder resist 62 is used to suppress adhesion of a material (for example, solder) for the terminals 71 and 72.

The terminals 71 and 72 are provided on the side of the fifth surface F5 of the resin layer 30 and are provided on the interconnects 41 and 42 on which the solder resist 61 is not provided, respectively. The terminals 71 and 72 are, for example, solder bumps. The terminal 71 is electrically connected to a rear surface of the semiconductor chip 10 via the interconnect 41, the via contact 51, and the metal layer 20, and is electrically connected to the semiconductor element 11 via the interconnect 41, the via contact 52, and the pad 31. Alternatively, the interconnect 41 electrically connected to the via contact 51 and another interconnect 41 electrically connected to the via contact 52 may be electrically isolated and connected to external terminals, respectively.

The semiconductor device 1 according to the present embodiment includes the metal layer 20 having a surface area larger than a surface area of the semiconductor chip 10 on the second surface F2 of the semiconductor chip 10. With this configuration, the semiconductor device 1 is configured such that the via contact 51 can be provided on the third surface F3 of the metal layer 20, and that the metal layer 20 on the side of the second surface F2 of the semiconductor chip 10 can be electrically connected to the interconnect 41 on the side of the first surface F1 of the semiconductor chip 10. Therefore, the semiconductor device 1 is configured such that not only the interconnect 42 that is electrically connected to the semiconductor element 11 on the side of the first surface F1 of the semiconductor chip 10 but also the interconnect 41 that is electrically connected to the metal layer 20 on the side of the second surface F2 thereof can be provided on the first surface F1. That is, the interconnects 41 and 42 extend out toward one surface (F5) of the resin layer 30 and not toward the other surface (F6) thereof. In this way, providing one-sided interconnects enables the via contacts 51 to 53 and the interconnects 41 and 42 to be formed by processing from a direction of the fifth surface F5 of the resin layer 30. That is, in the semiconductor device 1 according to the present embodiment, there is no need to process the two surfaces of the resin layer 30 for forming the via contacts and the interconnects.

Double-sided processing prolongs a manufacturing process if each surface is processed at a different time. Alternatively, the double-sided processing requires a special device if the two surfaces are to be processed simultaneously. Accordingly, the double-sided processing disadvantageously complicates the manufacturing process and increases a manufacturing cost.

According to the present embodiment, by contrast, it suffices to process the via contacts 51 to 53 and the interconnects 41 and 42 from a direction of one surface of the resin layer 30. Therefore, according to the present embodiment, it is possible to form the via contacts 51 to 53 and the interconnects 41 and 42 on electrodes of the first surface F1 and the second surface F2 of the semiconductor chip 10 provided within the resin layer 30 easily at a low cost.

Furthermore, in the present embodiment, while the solder resist 62 is provided on the fourth surface F4 of the metal layer 20, the metal layer 20 can function not only as a rear surface electrode of the semiconductor chip 10 but also as a heat dissipation plate of the semiconductor chip 10. If the metal layer 20 is used as the heat dissipation plate, it is unnecessary to provide the solder resist 62 at least on a portion of the fourth surface F4 of the metal layer 20.

A method of manufacturing the semiconductor device 1 according to the present embodiment will next be described.

FIGS. 2A to 11 are cross-sectional views illustrating an example of the method of manufacturing the semiconductor device 1 according to the first embodiment. First, as illustrated in FIG. 2A, in a wafer process step, the semiconductor element 11 and the pads 31 and 32 are formed on a semiconductor wafer 15. The semiconductor wafer 15 is, for example, a semiconductor substrate such as a silicon substrate.

The pads 31 and 32 are formed by utilizing plating or the like on electrodes (not illustrated) and the like of the semiconductor element 11 with copper. The pads 31 and 32 are thereby plated on the electrodes of the semiconductor element and/or the interlayer insulating film ILD of the semiconductor element 11.

Next, as illustrated in FIG. 2B, a rear surface of the semiconductor wafer 15 is polished using CMP (Chemical Mechanical Polishing) or grinding. The semiconductor wafer 15 is thereby thinned to have a thickness of, for example, about 20 μm to about 200 μm.

As illustrated in FIG. 2C, a metal thin film 17 is then formed on the rear surface of the semiconductor wafer 15 using sputtering or vapor deposition. The metal thin film 17 can improve wettability of a die attachment material and appropriately, adhesively bond the semiconductor chip 10 to a lead frame 25 (shown in FIG. 4A) which may be the metal layer 20 by means of the die attachment material. The metal thin film 17 may be, for example, a stacked film of Ti, Ni, and Ag, a stacked film of Cr, Ni, and Ag or a stacked film of Ti, Ni, and Au. A thickness of the metal thin film 17 is far smaller than a thickness of the metal film 20 (which is, for example, equal to or larger than 80 μm) and is, for example, equal to or smaller than about 2 μm. Thus, the metal thin film 17 is thin enough not to adversely influence a subsequent dicing step. It is noted that there is no need to form the metal thin film 17 on the rear surface of the semiconductor chip 10 as long as the die attachment material exhibits high wettability on the rear surface of the semiconductor chip 10. It is thereby possible to prevent the occurrence of flash and peeling of the metal thin film 17 in the dicing step and further improve productivity.

Figure 3:
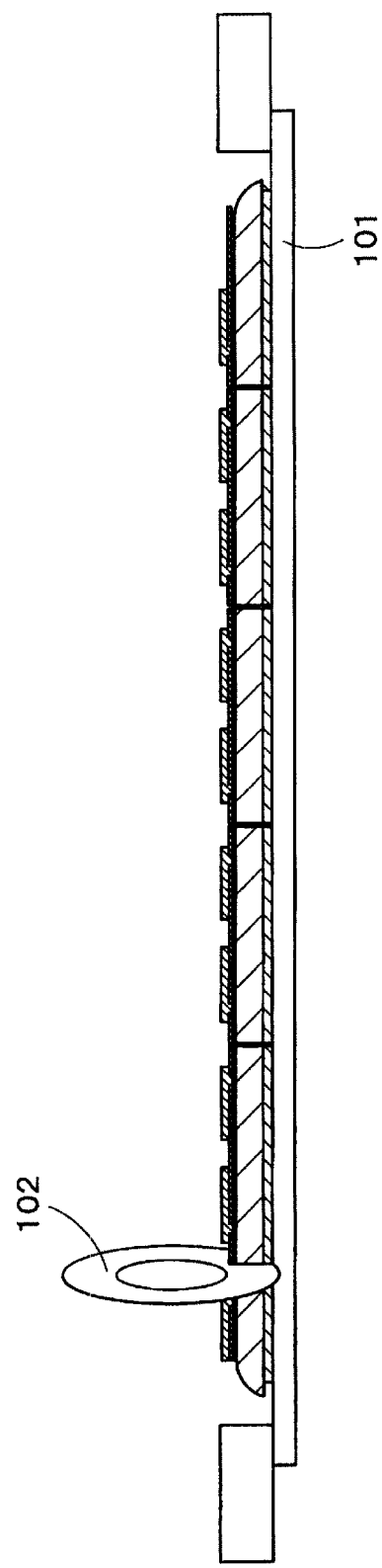
FIG. 3 is a cross-sectional view, subsequent to FIGS. 2A to 2C, illustrating the example of the method of manufacturing the semiconductor device.

As illustrated in FIG. 3, the semiconductor wafer 15 is then placed on a dicing tape 101 and the semiconductor wafer 15 is diced by a dicing blade 102. This dicing step causes the semiconductor wafer 15 to be separated into a plurality of semiconductor chips 10. At this stage, each semiconductor chip 10 includes the semiconductor element 11, the interlayer insulating film ILD, and the pads 31 and 32 on the first surface F1.

As illustrated in FIGS. 4A and 4B, the semiconductor chips 10 are then mounted on the lead frame 25 using a die attachment material 26. FIG. 4A is a plan view of the lead frame 25 and the semiconductor chips 10, and FIG. 4B is a cross-sectional view of the lead frame 25 and the semiconductor chips 10. The lead frame 25 is formed from, for example, a low resistance metal such as copper and a thickness thereof is about 80 μm. The die attachment material 26 may be, for example, a solder, a silver paste, a silver sintered paste or a conductive DAF (Die Attachment Film) and a form thereof may be either a liquid form or a film form.

As illustrated in FIG. 5, the lead frame 25 on which the semiconductor chips 10 are mounted is then placed on a dicing tape 103 and the lead frame 25 is diced by a dicing blade 104. The lead frame 25 is thereby diced for every semiconductor chip 10, and each diced lead frame 25 functions as one metal layer 20. The metal layer 20 has the third surface F3 on which the semiconductor chip 10 is placed and the fourth surface F4 opposite to the third surface F3. Furthermore, the third surface F3 of the metal layer 20 has the outer edge larger than the outer edge of the second surface F2 of the semiconductor chip 10.

A structure configured with the semiconductor chip 10 and the metal layer 20 will be referred to as "structure 130" hereinafter for the sake of convenience.

Figure 6:
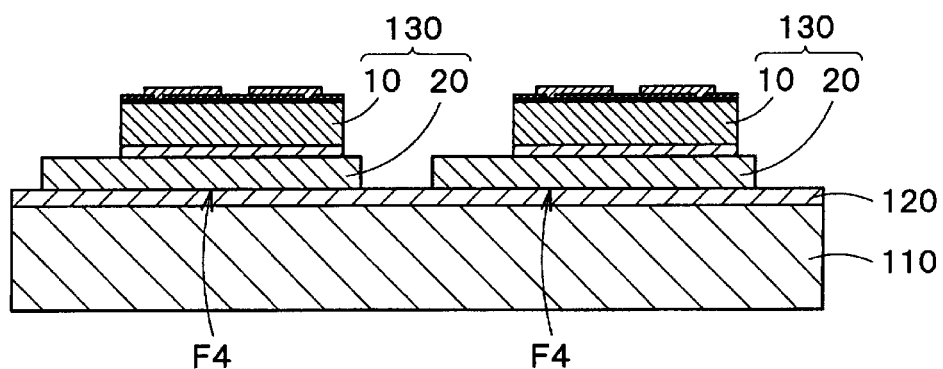
FIG. 6 is a cross-sectional view, subsequent to FIG. 5, illustrating the example of the method of manufacturing the semiconductor device.

As illustrated in FIG. 6, the structures 130 each configured with the semiconductor chip 10 and the metal layer 20 are then adhesively bonded onto a support portion 110 using an adhesive layer 120. In the present embodiment, a plurality of structures 130 are adhesively bonded onto the support portion 110 so that the fourth surface F4 of each metal layer 20 faces the support portion 110. That is, the structures 130 are mounted with the element formation surface (F1) of each semiconductor chip 10 placed face up ("face up mounting"). The support portion 110 may be, for example, a silicon plate, a metal plate (made of, for example, copper, iron or stainless steel) or a glass ($SiO_2$) plate. A thickness of the support portion 110 may be, for example, about 0.1 mm to about 2 mm. The adhesive layer 120 maybe, for example, an organic adhesive, a metal-based adhesive or a mixture thereof. It is noted that the face up mounting is advantageous over face down mounting, to be described later, in that the resin layer 30 can be formed at a single time. Therefore, the face up mounting enables the semiconductor device 1 to be manufactured at a relatively low cost.

Figure 7:
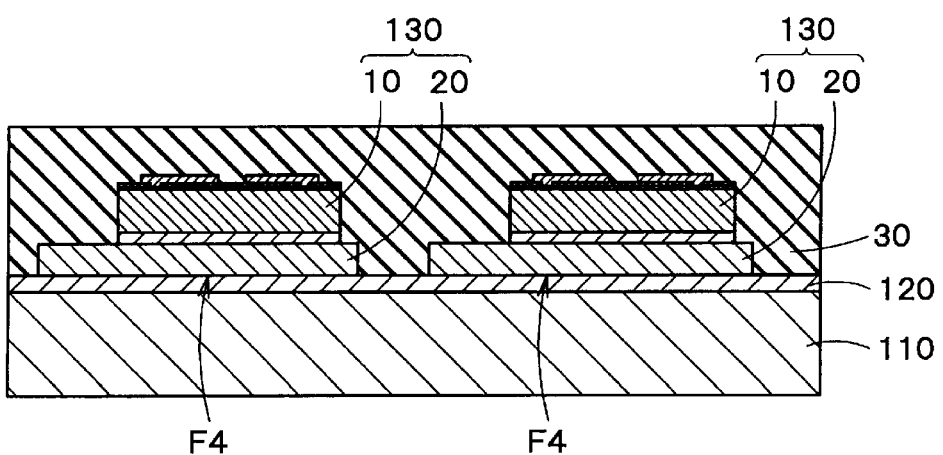
FIG. 7 is a cross-sectional view, subsequent to FIG. 6, illustrating the example of the method of manufacturing the semiconductor device.

As illustrated in FIG. 7, the resin layer 30 is then formed around the plurality of structures 130 on the support portion 110 and the plurality of structures 130 are encapsulated in the resin layer 30. The resin layer 30 is thereby formed to have the fifth surface F5 on the side of the semiconductor chips 10 and the sixth surface F6 on the side of the metal layers 20 (both F5 and F6 shown in FIG. 1). The plurality of structures 130 can be encapsulated in the resin layer 30 by, for example, stacking or vacuum-pressing an organic film. At this time, an organic film excluding portions corresponding to the structures 130 may be used. In this case, a thin organic film is covered on the structures 130 after formation of the organic film. Alternatively, the resin layer 30 may be formed by coating a liquid resin material as an alternative to the organic film.

Figure 8:
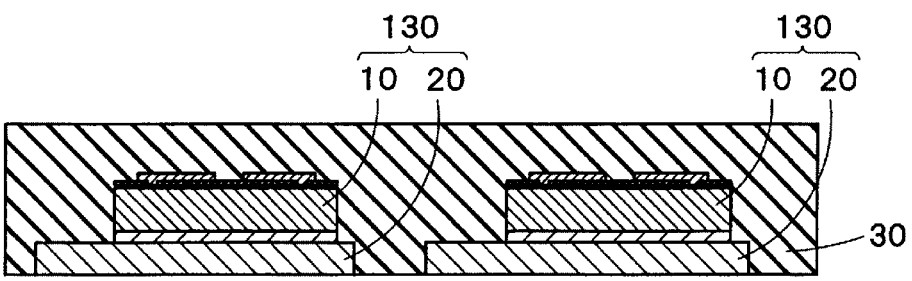
FIG. 8 is a cross-sectional view, subsequent to FIG. 7, illustrating the example of the method of manufacturing the semiconductor device.

As illustrated in FIG. 8, the support portion 110 is then peeled off from the structures 130 and the resin layer 30. The peeling of the support portion 110 is implemented by, for example, heating, light irradiation, immersion in a solvent or mechanical peeling. The peeling of the support portion 110 can be implemented after formation of the interconnects 41 and 42 to be described later.

Figure 9:
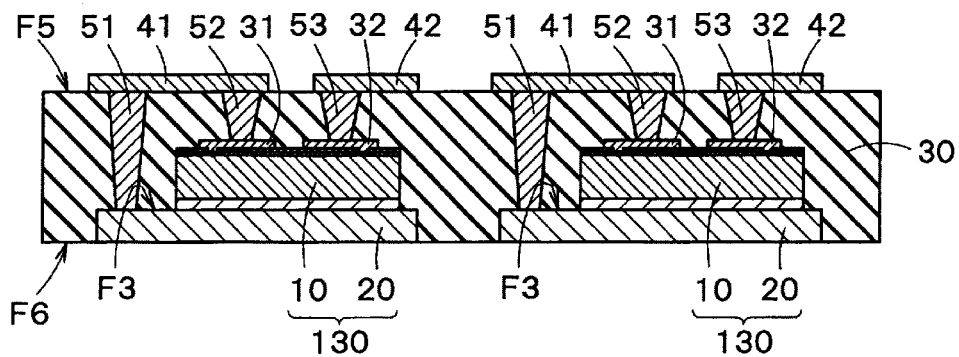
FIG. 9 is a cross-sectional view, subsequent to FIG. 8, illustrating the example of the method of manufacturing the semiconductor device.

As illustrated in FIG. 9, the via contacts 51 to 53 are then formed within the resin layer 30. Each via contact 51 is formed on the third surface F3 of each metal layer 20, and the via contacts 52 and 53 are formed on the first surface F1 of each semiconductor chip 10. At this time, the via contacts 51 to 53 are all formed from a direction of the fifth surface F5 of the resin layer 30. For example, via holes are formed from the direction of the fifth surface F5 of the resin layer 30 to the metal layer 20 and the pads 31 and 32. The via holes are formed using, for example, laser via machining. Alternatively, the via holes maybe formed using, for example, a lithography technique and an etching technique. After cleaning the via holes, a metal is filled into the via holes from the direction of the fifth surface F5 of the resin layer 30. The metal is formed into the via holes using, for example, electroless copper plating. The via contacts 51 to 53 can be thereby all formed from the direction of one surface side of the resin layer 30. It is noted that since the metal layer 20 is larger than the semiconductor chip 10, the via contact 51 can come in contact with the third surface F3 of the metal layer 20 from the direction of the fifth surface F5 of the resin layer 30.

Next, the interconnects 41 and 42 are formed on the fifth surface F5 of the resin layer 30. At this time, each interconnect 41 is formed on the fifth surface F5 of the resin layer 30 and on the via contacts 51 and 52. Each interconnect 42 is formed on the fifth surface F5 of the resin layer 30 and on each via contact 53.

Figure 10:
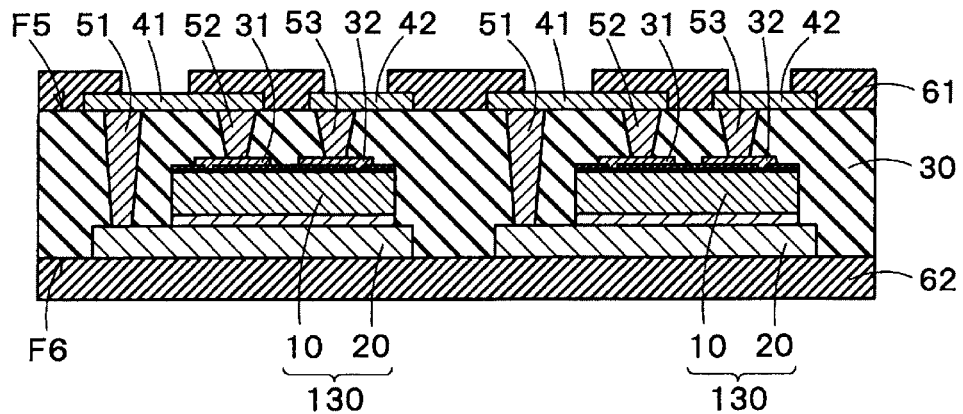
FIG. 10 is a cross-sectional view, subsequent to FIG. 9, illustrating the example of the method of manufacturing the semiconductor device.

As illustrated in FIG. 10, the solder resists 61 and 62 are then formed on the fifth surface F5 and the sixth surface F6 of the resin layer 30, respectively. The solder resist 61 on the fifth surface F5 is then patterned using the lithography technique. The interconnects 41 and 42 are thereby partially exposed.

Figure 11:
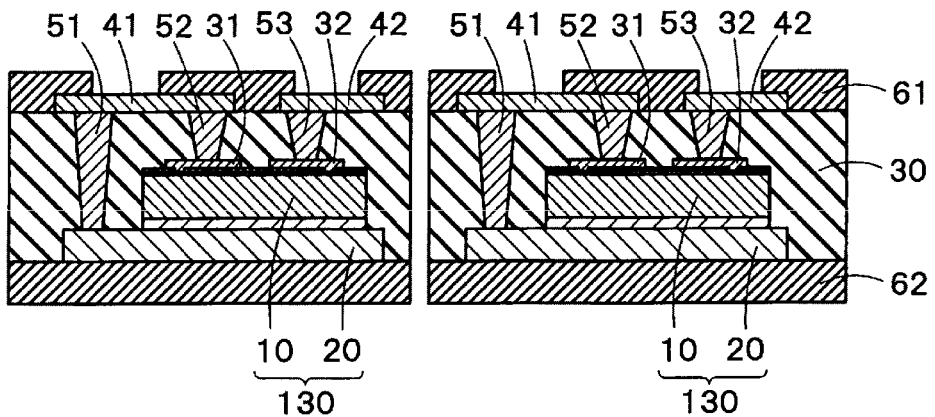
FIG. 11 is a cross-sectional view, subsequent to FIG. 10, illustrating the example of the method of manufacturing the semiconductor device.

As illustrated in FIG. 11, the structures 130 are then diced. The semiconductor packages each including one semiconductor chip 10 are thereby separated.

The terminals 71 and 72 are then formed on the interconnects 41 and 42, respectively. For example, a solder is used for the terminals 71 and 72. As a result, the semiconductor device 1 illustrated in FIG. 1 is completed. If the metal layer 20 is used as the heat dissipation plate, the solder resist 62 on the fourth surface F4 of the metal layer 20 may be removed after formation of the terminals 71 and 72.

According to the present embodiment, the via contacts 51 to 53, the interconnects 41 and 42, and the terminals 71 and 72 are formed on one surface of the resin layer 30. Therefore, the semiconductor device 1 according to the present embodiment can be formed easily at a low cost.

Figure 12:
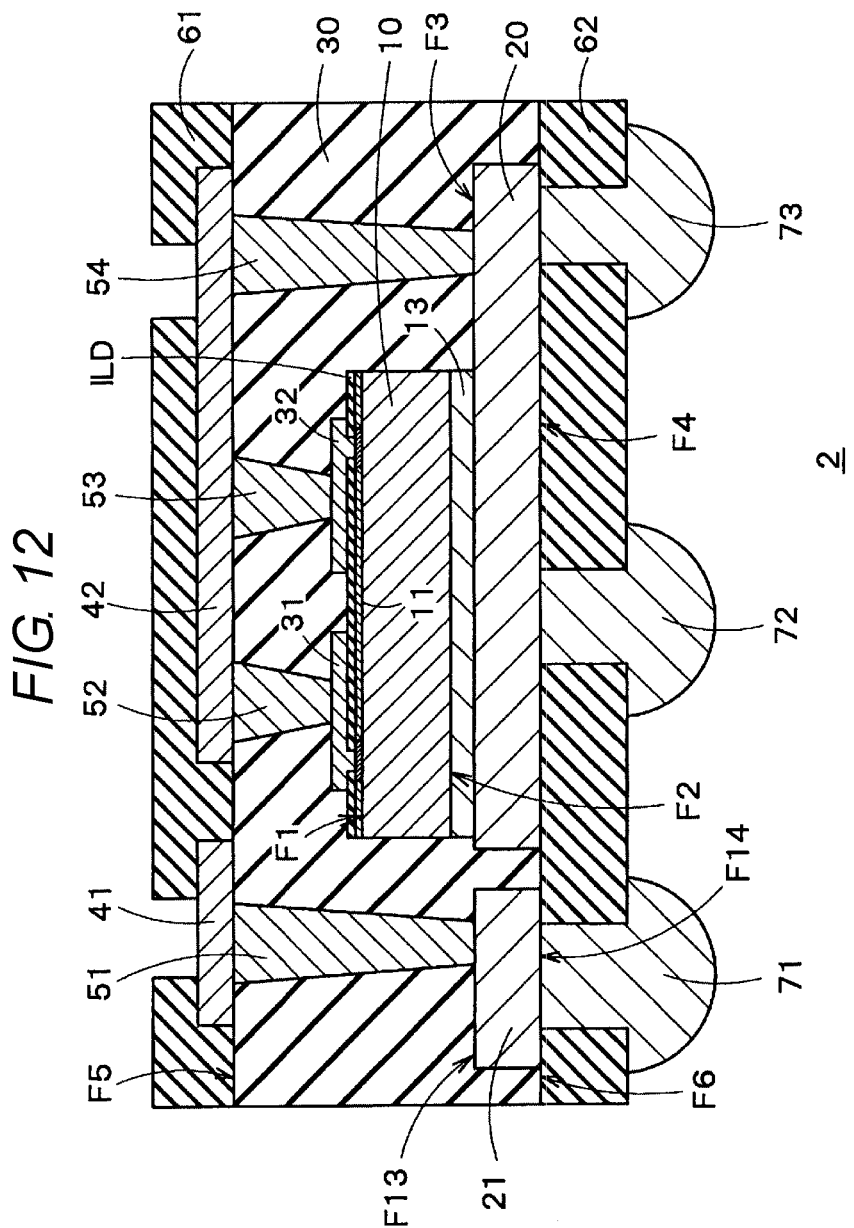
FIG. 12 is a cross-sectional view illustrating an example of a configuration of a semiconductor device according to a second embodiment.

(Second Embodiment) FIG. 12 is a cross-sectional view illustrating an example of a configuration of a semiconductor device 2 according to a second embodiment. The second embodiment differs from the first embodiment in that terminals 71 to 73 are provided on the sixth surface F6 of the resin layer 30.

It is noted that configurations of the metal layers 20 and 21, arrangement of via contacts 51 to 54, layout of the interconnects 41 and 42, arrangement of the terminals 71 to 73, and the like can be arbitrarily changed. For example, in the second embodiment, two separate metal layers 20 and 21 are used. The semiconductor chip 10 is placed on the third surface F3 of the metal layer 20, and the via contact 51 is provided on a surface F13 of the metal layer 21. The via contact 51 is connected to the interconnect 41. The interconnect 41 may be connected to the other pad (not illustrated) of the semiconductor chip 10.

Similarly to the first embodiment, the third surface F3 of the metal layer 20 has the outer edge larger than the outer edge of the second surface F2 of the semiconductor chip 10. Therefore, the via contact 54 is provided on the third surface F3 of the metal layer 20 and can be connected to the interconnect 42. The interconnect 42 is electrically connected to the pads 31 and 32 via the via contacts 52 and 53, respectively.

The terminal 71 is provided on a surface F14 of the metal layer 21. The terminals 72 and 73 are provided on the fourth surface F4 of the metal layer 20. That is, the terminals 71 to 73 are provided on the side of the sixth surface F6 of the resin layer 30. The other configurations according to the second embodiment may be the same as corresponding configurations according to the first embodiment.

According to the second embodiment, the terminals 71 to 73 are provided on the sixth surface F6 of the resin layer 30, while the via contacts 51 to 54 and the interconnects 41 and 42 are provided on the fifth surface F5 of the resin layer 30. Therefore, the interconnects 41 and 42 extend out of one surface (F5) of the resin layer 30 and not out of the other surface (F6). In this way, providing one-sided interconnects enables the via contacts 51 to 54 and the interconnects 41 and 42 to be formed by processing from the direction of the fifth surface F5 of the resin layer 30. The second embodiment can thereby attain the same advantages as those of the first embodiment. As described with reference to FIG. 11, the terminals 71 and 72 are formed after separation of the semiconductor packages, and may be, therefore, providing on the terminals 71 and 72 on the sixth surface F6 of the resin layer 30 causes no problems.

In the second embodiment, the interconnects 41 and 42 may be partially exposed. Thus, the other semiconductor device (not illustrated) may be stacked on the semiconductor device 2 and electrodes of the other semiconductor device may be connected to the interconnects 41 and 42. In this way, the semiconductor device 2 may be provided to have a three-dimensional stacked structure.

Since a manufacturing method according to the second embodiment is easily recognizable by referring to the manufacturing method according to the first embodiment, the manufacturing method according to the second embodiment is not described herein in detail.

Figure 13:
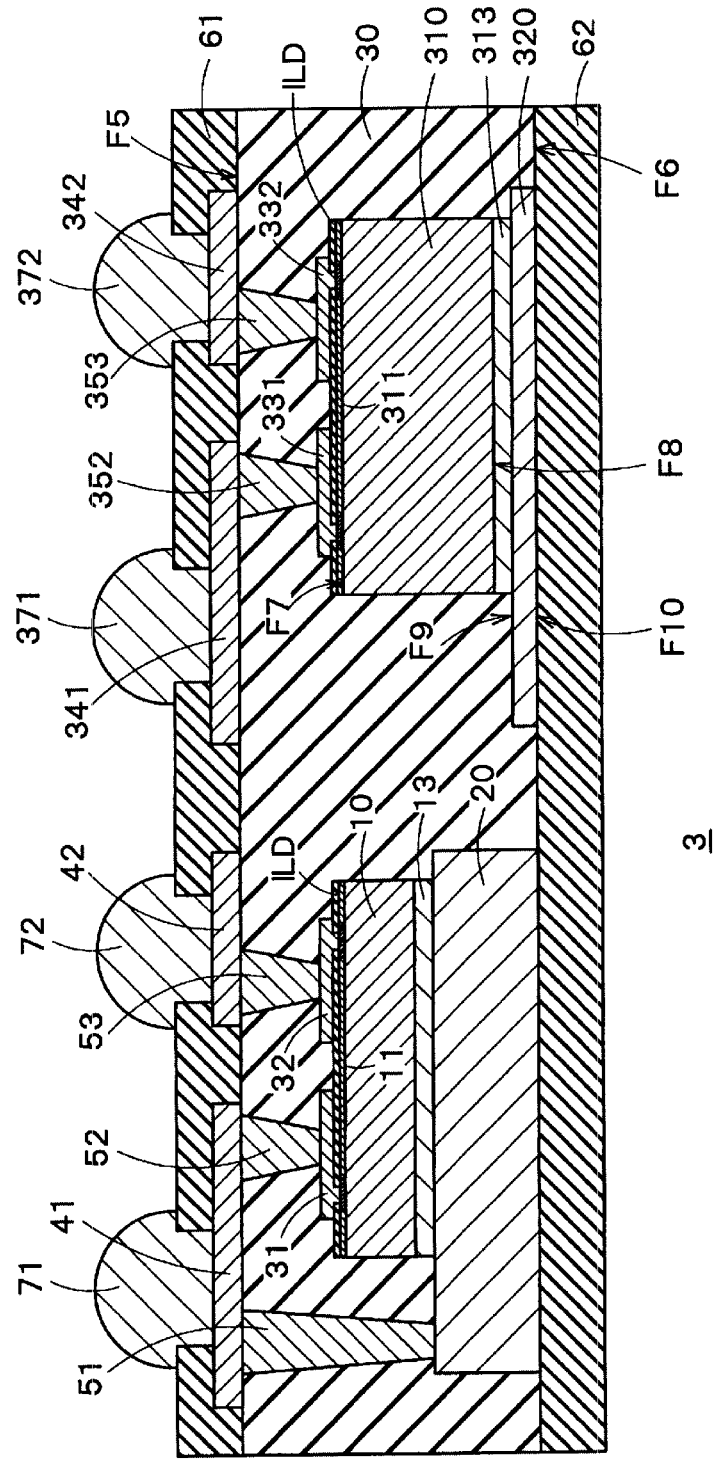
FIG. 13 is a cross-sectional view illustrating an example of a configuration of a semiconductor device according to a third embodiment.

(Third Embodiment) FIG. 13 is a cross-sectional view illustrating an example of a configuration of a semiconductor device 3 according to a third embodiment. The semiconductor device 3 is a semiconductor module having a plurality of semiconductor chips 10 and 310 incorporated into one semiconductor package.

A configuration of the semiconductor device on the side of the semiconductor chip 10, as a first semiconductor chip, maybe the same as the configuration of the semiconductor device 1 illustrated in FIG. 1. Therefore, a configuration of the semiconductor device on the side of the semiconductor chip 310, as a second semiconductor chip, will be described.

The semiconductor chip 310, as the second semiconductor chip, has a seventh surface F7 on which a semiconductor element 311 is provided, and an eighth surface F8 opposite to the seventh surface F7. A thickness of the semiconductor chip 310 differs from a thickness of the semiconductor chip 10. The semiconductor element 311 provided on the seventh surface F7 of the semiconductor chip 310 may be either the same as or different from the semiconductor element 11 on the semiconductor chip 10.

A metal layer 320, as a second metal layer, has a ninth surface F9 on which the semiconductor chip 310 is placed, and a tenth surface F10 opposite to the ninth surface F9. The ninth surface F9 faces the eighth surface F8 of the semiconductor chip 310 and is adhesively bonded to the semiconductor chip 310 by a conductor material 313. The ninth surface F9 has an outer edge larger than an outer edge of the eighth surface F8 of the semiconductor chip 310. Therefore, the metal layer 320 is provided to entirely cover the eighth surface F8 of the semiconductor chip 310. A material for the metal layer 320 may be the same as that for the metal layer 20. A material for the conductive material 313 may be the same as that for the conductive material 13.

Furthermore, a thickness of the metal layer 320 is smaller than a thickness of the metal layer 20. A sum of the thickness of the semiconductor chip 10 and the thickness of the metal layer 20 is substantially equal to a sum of the thickness of the semiconductor chip 310 and the thickness of the metal layer 320. It is thereby possible to make heights of the pads 31, 32, 331, and 332 substantially equal and make depths of via contacts 52, 53, 352, and 353 substantially equal.

The metal layer 320 can function not only as a rear surface electrode of the semiconductor chip 310 but also as a heat dissipation plate of the semiconductor chip 310. If the metal layer 320 is used as the heat dissipation plate, it is unnecessary to provide the solder resist 62 at least on a portion of the tenth surface F10 of the metal layer 320.

The pads 331 and 332 are provided on the seventh surface F7 of the semiconductor chip 310 via the interlayer insulating film ILD, and electrically connected to the semiconductor element 311. The pads 331 and 332 function as lead-out interconnects (fan-out interconnects) extending out from the semiconductor element 311. A material for the pads 331 and 332 may be the same as that for the pads 31 and 32.

The via contacts 352 and 353, as third via contacts, are provided within the resin layer 30 and are provided on the pads 331 and 332, respectively. The via contact 352 extends out from the pad 331 toward the fifth surface F5 of the resin layer 30, and electrically connects the pad 331 to an interconnect 341. The via contact 353 extends out from the pad 332 toward the fifth surface F5 of the resin layer 30, and electrically connects the pad 332 to an interconnect 342.

The interconnects 341 and 342, as third interconnects, are provided on the fifth surface F5 of the resin layer 30 and electrically connected to the pads 331 and 332 via the via contact 352 and 353, respectively. A material for the interconnects 341 and 342 may be the same as that for the interconnects 41 and 42. A material for the pads 331 and 332 may be the same as that for the pads 31 and 32. In this way, the interconnects 341 and 342 are provided on one surface (for example, the fifth surface F5) of the resin layer 30.

The terminals 371 and 372 are provided on the side of the fifth surface F5 of the resin layer 30 and provided on the interconnects 341 and 342 on which the solder resist 61 is not provided, respectively. The terminals 371 and 372 are, for example, solder bumps. The terminal 371 is electrically connected to the semiconductor element 311 via the interconnect 341, the via contact 352, and the pad 331. The terminal 372 is electrically connected to the semiconductor element 311 via the interconnect 342, the via contact 353, and the pad 332.

While the semiconductor device 3 according to the third embodiment includes the plurality of semiconductor chips 10 and 310, the interconnects 41, 42, 341, and 342 extend out toward one surface (F5) of the resin layer 30 and do not extend toward the other surface (F6). In this way, providing one-sided interconnects enables the via contacts 51 to 53, 352, and 353 and the interconnects 41, 42, 341, and 342 to be formed by processing from the direction of the fifth surface F5 of the resin layer 30. The third embodiment can thereby attain the same advantages as those of the first embodiment.

It is noted that no via contact connecting the metal layer 320 to the interconnect 341 is provided on the side of the semiconductor chip 310. However, a via contact (not illustrated) connecting the metal layer 320 to the interconnect 341 may be provided since the ninth surface F9 of the metal layer 320 has the outer edge larger than the outer edge of the semiconductor chip 310.

A method of manufacturing the semiconductor device 3 will next be described.

Through the steps described with reference to FIGS. 2 to 5, structures in which the semiconductor chips 10 and 310 are placed on the metal layers 20 and 320 are formed for the semiconductor chips 10 and 310, respectively.

Next, in the step illustrated in FIG. 6, the structures each including the semiconductor chip 10 and the metal layer 20 and the structures each including the semiconductor chip 310 and the metal layer 320 are laid side by side and arranged on the support portion 110.

Through the steps described with reference to FIGS. 7 to 10, the via contacts 51 to 353, the interconnects 41 to 342, and the like are formed. The semiconductor chip 310 is thicker than the semiconductor chip 10 but the metal layer 320 is thinner than the metal layer 20. The sum of the thickness of the semiconductor chip 10 and the thickness of the metal layer 20 is substantially equal to the sum of the thickness of the semiconductor chip 310 and the thickness of the metal layer 320. It is thereby possible to make the depths of the via contacts 52, 53, 352, and 353 substantially equal, so that the via contacts 52, 53, 352, 353 can be easily formed.

Next, semiconductor packages each having the structure 130 including the semiconductor chip 10 and the metal layer 20 and a structure including the semiconductor chip 310 and the metal layer 320 are diced. Each semiconductor package is thereby separated as a module that has the structure including the semiconductor chip 10 and the metal layer 20 and the structure including the semiconductor chip 310 and the metal layer 320.

According to the third embodiment, the via contacts 51 to 353, the interconnects 41 to 342, and the terminals 71 to 372 are formed on one surface of the resin layer 30. The third embodiment can thereby attain the same advantages as those of the first embodiment. The third embodiment may be combined with the second embodiment.

(Fourth Embodiment) By the manufacturing method according to the first embodiment, the semiconductor device 1 is manufactured by the so-called face up mounting. By a manufacturing method according to a fourth embodiment, in contrast, the semiconductor device 1 is manufactured by the so-called face down mounting.

Figure 14:
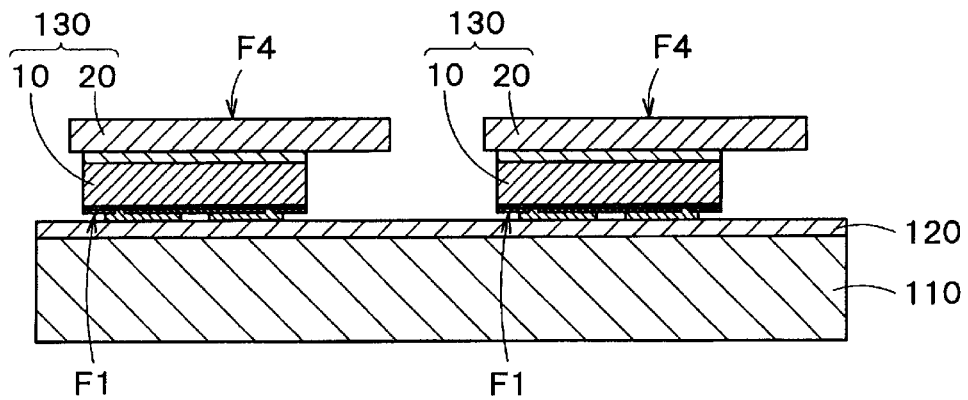
FIG. 14 is a cross-sectional view illustrating an example of a semiconductor device manufacturing method according to a fourth embodiment.

FIGS. 14 to 19 are cross-sectional views illustrating an example of the semiconductor device manufacturing method according to the fourth embodiment. After the steps illustrated in FIGS. 2A to 5, the structures 130 are adhesively bonded onto the support portion 110 so that the element formation surface (F1) of each semiconductor chip 10 faces the support portion 110, as illustrated in FIG. 14.

Figure 15:
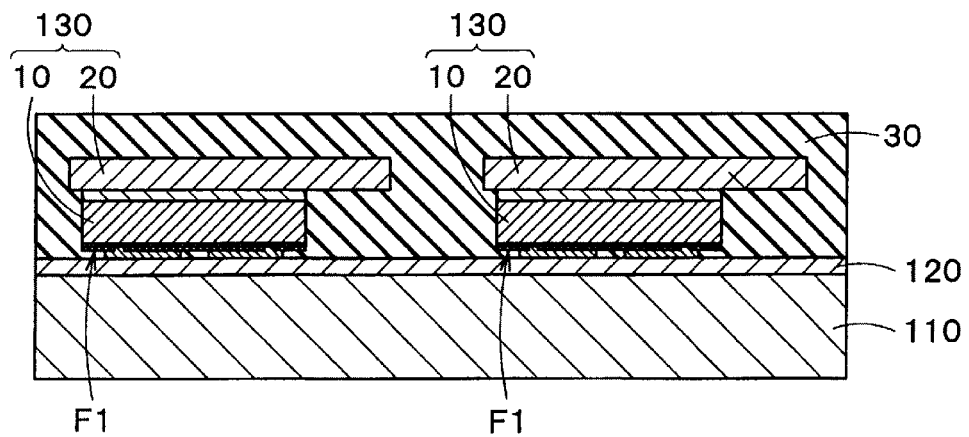
FIG. 15 is a cross-sectional view, subsequent to FIG. 14, illustrating the example of the method of manufacturing the semiconductor device.

As illustrated in FIG. 15, the resin layer 30 is then formed around the plurality of structures 130 on the support portion 110 and the plurality of structures 130 are encapsulated in the resin layer 30.

Figure 16:
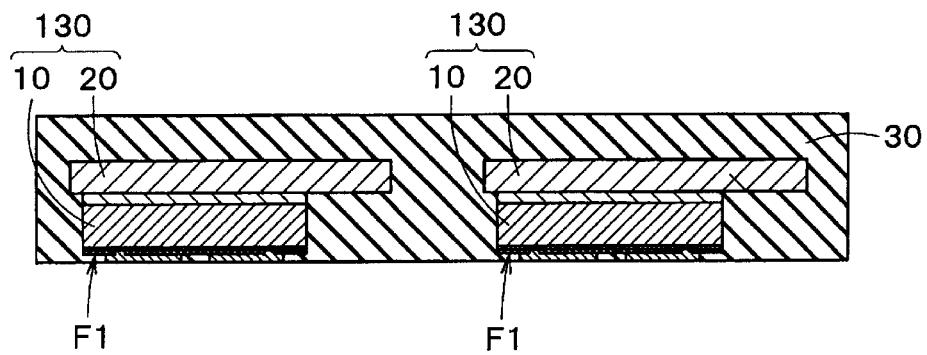
FIG. 16 is a cross-sectional view, subsequent to FIG. 15, illustrating the example of the method of manufacturing the semiconductor device.

As illustrated in FIG. 16, the support portion 110 is then peeled off from the structures 130 and the resin layer 30. The peeling of the support portion 110 can be implemented after formation of the interconnects 41 and 42 to be described later.

Figure 17:
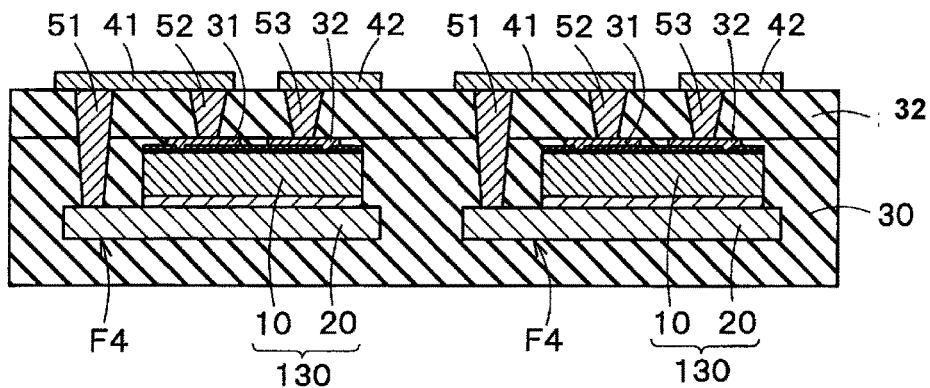
FIG. 17 is a cross-sectional view, subsequent to FIG. 16, illustrating the example of the method of manufacturing the semiconductor device.

As illustrated in FIG. 17, after a resin layer 32 is further formed on the resin layer 30, the via contacts 51 to 53 and the interconnects 41 and 42 are formed as described with reference to FIG. 9.

Figure 18:
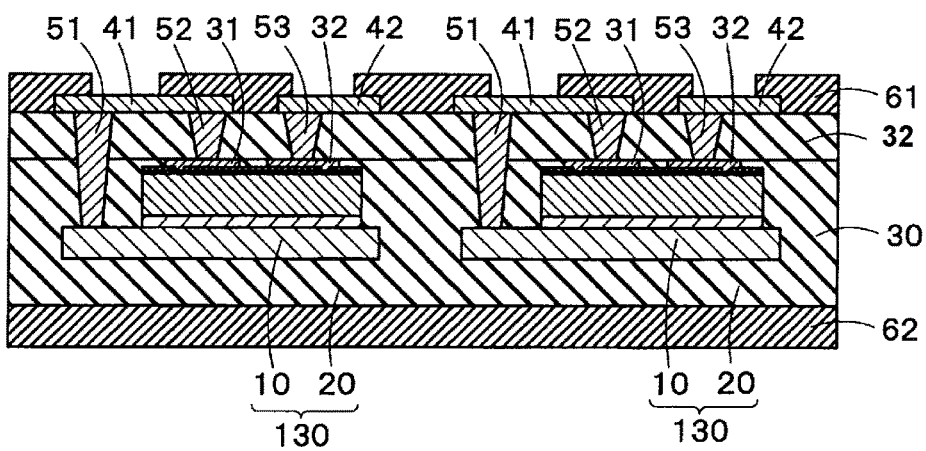
FIG. 18 is a cross-sectional view, subsequent to FIG. 17, illustrating the example of the method of manufacturing the semiconductor device.

As illustrated in FIG. 18, the solder resists 61 and 62 are then formed on one surface of the resin layer 32 and the sixth surface F6 of the resin layer 30, respectively. The solder resist 61 on the interconnects 41 and 42 is then patterned using the lithography technique. The interconnects 41 and 42 are thereby partially exposed.

Figure 19:
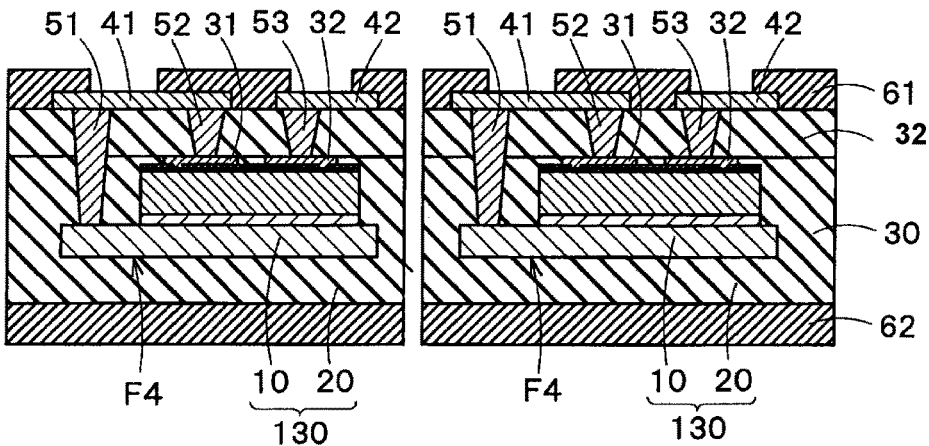
FIG. 19 is a cross-sectional view, subsequent to FIG. 18, illustrating the example of the method of manufacturing the semiconductor device.

As illustrated in FIG. 19, the structures 130 are then diced. The semiconductor packages each including one semiconductor chip 10 are thereby separated.

The terminals 71 and 72 are then formed on the interconnects 41 and 42, respectively. As a result, the semiconductor device 1 illustrated in FIG. 1 is completed. If the metal layer 20 is used as the heat dissipation plate, the solder resist 62 and the resin layer 30 on the fourth surface F4 of the metal layer 20 may be removed after formation of the terminals 71 and 72.

In this way, the face down mounting according to the fourth embodiment can similarly manufacture the semiconductor device 1 and the fourth embodiment can attain the same advantages as those of the first embodiment.

Furthermore, with the face down mounting, the resin layer 32 provided on the pads 31 and 32 is formed separately from the resin layer 30, so that it is possible to stabilize a thickness of the resin layer 32. It is, therefore, possible to arrange the via contacts and the like at a narrow pitch and achieve the further miniaturization of the semiconductor device 1.

Alternatively, a frame formed from a prepreg or a metal may be provided around the semiconductor chip 10. Providing the frame can improve rigidity of the semiconductor device 1 and reduce a thermal resistance. Furthermore, using the metal frame as a shield can improve noise resistance of the semiconductor device 1.

The fourth embodiment may be combined with the second or third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor device comprising:
a first metal layer having a first surface and a second surface opposing the first surface;
a first semiconductor chip on the first surface of the first metal layer;
a first via contact on the first surface of the first metal layer;
a second via contact on the first semiconductor chip;
a resin layer encapsulating the first metal layer, the first semiconductor chip, the first via contact, and the second via contact, the resin layer having a third surface and exposing a first end of the first via contact and a second end of the second via contact in the third surface;
a first interconnect on the third surface of the resin layer; and
a second interconnect on the third surface of the resin layer.

2. The semiconductor device according to claim 1, wherein
the first surface of the first metal layer is larger than a chip area of the first semiconductor chip.

3. The semiconductor device according to claim 1, wherein
the first metal layer has a perimeter larger than a perimeter of the first semiconductor chip.

4. The semiconductor device according to claim 1, wherein
the first metal layer has an outer edge protruding more outer than an outer edge of the first semiconductor chip.

5. The semiconductor device according to claim 1, wherein
the resin layer further has a fourth surface opposing the third surface and located in the first metal layer side and the third surface is located in the first semiconductor chip layer.

6. The semiconductor device according to claim 1, wherein
the second surface of the first metal layer is exposed from the resin layer.

7. The semiconductor device according to claim 1, further comprising:
a second metal layer spaced apart from the first metal layer; and
a third via contact on the second metal layer, a third end of the third via contact exposed from the resin layer in the third surface thereof.

8. The semiconductor device according to claim 1, further comprising:
a second metal layer;
a second semiconductor chip on the second metal layer; and
a third via contact on the second semiconductor chip,
wherein the resin layer surrounds the second metal layer, the second semiconductor chip, and the third via contact and exposes an third end of the third via contact in the third surface.

9. The semiconductor device according to claim 8,
wherein a thickness of the second metal layer differs from a thickness of the first metal layer, and
wherein a sum of a thickness of the first semiconductor chip and the thickness of the first metal layer is substantially equal to a sum of a thickness of the second semiconductor chip and the thickness of the second metal layer.

10. The semiconductor device according to claim 1, further comprising:
a terminal coupled to the first interconnect, the second interconnect, or the first metal layer.

11. A semiconductor device comprising:
a first metal layer having a first surface and a second surface opposing the first surface;
a first semiconductor chip on the first surface of the first metal layer, a chip area of the first semiconductor chip smaller than the first surface of the first metal layer;
a first via contact on the first surface of the first metal layer;
a second via contact on the first semiconductor chip;

a resin layer encapsulating the first metal layer, the first semiconductor chip, the first via contact, and the second via contact and having a third surface;

a first interconnect on the third surface of the resin layer and electrically connected to the first via contact; and a second interconnect on the third surface of the resin layer and electrically connected to the second via contact.

12. The semiconductor device according to claim 11, wherein
the first metal layer has an outer edge protruding more outer than an outer edge of the first semiconductor chip.

13. The semiconductor device according to claim 11, wherein
the resin layer further has a fourth surface opposing the third surface and located in the first metal layer side and the third surface is located in the first semiconductor chip layer.

14. The semiconductor device according to claim 11, wherein
the second surface of the first metal layer is exposed from the resin layer.

15. The semiconductor device according to claim 11, further comprising:
a second metal layer spaced apart from the first metal layer; and
a third via contact provided on the second metal layer and extending to the third surface of the resin layer.

16. The semiconductor device according to claim 11, further comprising:
a second metal layer;
a second semiconductor chip on the second metal layer; and
a third via contact on the second semiconductor chip, wherein
the resin layer surrounds the second metal layer, the second semiconductor chip, and the third via contact and exposes an third end of the third via contact in the third surface.

17. The semiconductor device according to claim 16, wherein a thickness of the second metal layer differs from a thickness of the first metal layer, and
wherein a sum of a thickness of the first semiconductor chip and the thickness of the first metal layer is substantially equal to a sum of a thickness of the second semiconductor chip and the thickness of the second metal layer.

18. The semiconductor device according to claim 11, further comprising:
a terminal coupled to the first interconnect, the second interconnect, or the first metal layer.

* * * * *